(12) United States Patent
Yanai et al.

(10) Patent No.: US 11,015,977 B2
(45) Date of Patent: *May 25, 2021

(54) OPTICAL LAMINATED FILM ALLOWING DETECTION OF POLARIZATION STATE, AND POLARIZATION IMAGING SENSOR USING OPTICAL LAMINATED FILM COMPRISING DUAL PHASE DIFFERENCE PLATES WITH PATTERNED OPTICAL ANISOTROPIC LAYERS

(71) Applicant: FUJIFILM Corporation, Tokyo (JP)

(72) Inventors: Yujiro Yanai, Minami-ashigara (JP); Jun Takeda, Minami-ashigara (JP); Michio Nagai, Minami-ashigara (JP); Akira Yamamoto, Minami-ashigara (JP)

(73) Assignee: FUJIFILM Corporation, Tokyo (JP)

( * ) Notice: Subject to any disclaimer, the term of this patent is extended or adjusted under 35 U.S.C. 154(b) by 340 days.

This patent is subject to a terminal disclaimer.

(21) Appl. No.: 16/146,131

(22) Filed: Sep. 28, 2018

(65) Prior Publication Data

US 2019/0041270 A1    Feb. 7, 2019

Related U.S. Application Data

(63) Continuation of application No. PCT/JP2017/011157, filed on Mar. 21, 2017.

(30) Foreign Application Priority Data

Mar. 30, 2016   (JP) .............................. JP2016-068482

(51) Int. Cl.
    *G01J 4/04*    (2006.01)
    *H01L 27/14*   (2006.01)
    (Continued)

(52) U.S. Cl.
    CPC ................ *G01J 4/04* (2013.01); *G01N 21/21* (2013.01); *G02B 5/3025* (2013.01);
    (Continued)

(58) Field of Classification Search
    CPC ......... G01J 4/04; G01N 21/21; G02B 27/286; G02B 5/3025; G02B 5/3083;
    (Continued)

(56) References Cited

U.S. PATENT DOCUMENTS 6,806,930 B2 * 10/2004 Moia ................ G06K 19/06046
                                                      349/117
10,670,921 B2 *  6/2020 Yanai ................... G02B 5/3008
(Continued)

FOREIGN PATENT DOCUMENTS

JP          4153412 B2      9/2008
JP       2010-113249 A      5/2010
(Continued)

OTHER PUBLICATIONS

International Preliminary Report on Patentability and Written Opinion of the International Searching Authority (forms PCT/IB/373, PCT/ISA/237 and PCT/IB/326), dated Oct. 11, 2018, for corresponding International Application No. PCT/JP2017/011157, with an English translation of the Written Opinion.
(Continued)

*Primary Examiner* — Que Tan Le
(74) *Attorney, Agent, or Firm* — Birch, Stewart, Kolasch & Birch, LLP

(57) ABSTRACT

An object of the invention is to provide an optical laminated film capable of detecting a light polarization state with a simple configuration using components which are superior in productivity and have high versatility, and a polarization imaging sensor using the optical laminated film. An optical laminated film includes: first and second phase difference (Continued)

plates, each having a patterned optical anisotropic layer; and a polarizing plate having a polarization axis in one direction, the patterned optical anisotropic layers have a constant phase difference, are divided into a plurality of belt-like regions in the same plane, and have a plurality of units, each formed of the plurality of belt-like regions in which slow axis directions in one belt-like region coincide with each other, and slow axis directions in the respective belt-like regions are all different, and the first phase difference plate, the second phase difference plate, and the polarizing plate are laminated in this order such that the belt-like regions of the two phase difference plates intersect with each other.

9 Claims, 4 Drawing Sheets

(51) Int. Cl.
*G02B 27/28* (2006.01)
*G01N 21/21* (2006.01)
*G02B 5/30* (2006.01)
*H01L 27/146* (2006.01)

(52) U.S. Cl.
CPC ............ *G02B 27/286* (2013.01); *H01L 27/14* (2013.01); *H01L 27/146* (2013.01)

(58) Field of Classification Search
CPC ....... G02B 5/1833; G02B 5/30; H01L 27/146; G02F 1/133631; G02F 1/116; G02F 1/133509; G02F 1/13363; G02F 1/133634
USPC ...................................... 250/225, 208.1, 216
See application file for complete search history.

(56) References Cited

U.S. PATENT DOCUMENTS

| 2007/0268490 A1 | 11/2007 | Kawakami et al. |
| 2010/0119738 A1 | 5/2010 | Suzuki et al. |
| 2014/0016081 A1 | 1/2014 | Kakubari et al. |

FOREIGN PATENT DOCUMENTS

| JP | 2012-215794 A | 11/2012 |
| JP | 2015-219398 A | 12/2015 |

OTHER PUBLICATIONS

International Search Report (form PCT/ISA/210), dated Jun. 20, 2017, for corresponding International Application No. PCT/JP2017/011157, with an English translation.

* cited by examiner

OPTICAL LAMINATED FILM ALLOWING DETECTION OF POLARIZATION STATE, AND POLARIZATION IMAGING SENSOR USING OPTICAL LAMINATED FILM COMPRISING DUAL PHASE DIFFERENCE PLATES WITH PATTERNED OPTICAL ANISOTROPIC LAYERS

CROSS-REFERENCE TO RELATED APPLICATIONS

This application is a Continuation of PCT International Application No. PCT/JP2017/011157 filed on Mar. 21, 2017, which claims priority under 35 U.S.C. § 119(a) to Japanese Patent Application No. 2016-068482 filed on Mar. 30, 2016. The above application is hereby expressly incorporated by reference, in its entirety, into the present application.

BACKGROUND OF THE INVENTION

1. Field of the Invention

The present invention relates to an optical laminated film allowing the detection of a polarization state, and a polarization imaging sensor using the optical laminated film.

2. Description of the Related Art

Polarization imaging sensors detecting a polarization state of light from a subject have been known.

According to this polarization imaging sensor, it is possible to obtain information which cannot be obtained from a usual monochrome image or color image, such as an inclination of a surface of an object, clarification of a shape and a boundary difficult to be discriminated, and detection of a state of a stress applied to the object.

Therefore, the polarization imaging sensor is considered to be used in various fields such as examination, medical treatment, assistance for driving, operations, and security.

For example, a polarization analyzer described in JP4153412B has been known as such a polarization imaging sensor.

In the polarization analyzer, a wavelength plate array having a plurality of wavelength plate regions which have a constant phase difference and have different slow axis directions, and a polarizing plate array having a plurality of polarizing plate regions in which polarization axis directions of polarized light passing therethrough are different are superimposed such that the wavelength plate array serves as a front surface and the polarizing plate array serves as a rear surface. The intensity distribution of light passing through the arrays is measured by a light-receiving element array, the variation pattern of a concentration of an output image obtained by the light-receiving element array is analyzed, and thus a polarization state of the incident light is detected.

SUMMARY OF THE INVENTION

According to the polarization imaging sensor described in JP4153412B, by combining the polarizing plate array, the wavelength plate array, and the light-receiving element array, a driving portion such as a polarizing plate rotation mechanism can be eliminated, and thus polarization information of light from a subject can be rapidly obtained with a small-sized sensor.

The polarization imaging sensor described in JP4153412B uses the polarizing plate array having a plurality of polarizing plate regions in which polarization axis directions of polarized light passing therethrough are different. Such a polarizing plate array in which the polarization axis is patterned is difficult to produce, and thus productivity thereof is low. In addition, versatility is also low. Moreover, in the polarizing plate array in which the polarization axis is patterned, it is difficult to finely set the polarization axis direction with a small angular difference, and thus it is also difficult to improve the detection accuracy of the polarization state to a certain level or higher.

An object of the invention is to solve the problems of the related arts, and to provide an optical laminated film having a simple configuration and allowing the detection of a polarization state using components which are superior in productivity and have high versatility, and a polarization imaging sensor using the optical laminated film.

In order to achieve the object, provided is an optical laminated film according to the invention comprising: a first phase difference plate having a patterned optical anisotropic layer; a second phase difference plate having a patterned optical anisotropic layer; and a polarizing plate having a polarization axis in one direction, in which the patterned optical anisotropic layer of the first phase difference plate and the patterned optical anisotropic layer of the second phase difference plate have a constant phase difference, and are divided into a plurality of belt-like regions in the same plane, the patterned optical anisotropic layer of the first phase difference plate and the patterned optical anisotropic layer of the second phase difference plate have a plurality of units, each formed of the plurality of belt-like regions in which slow axis directions in one belt-like region coincide with each other, and slow axis directions in the respective belt-like regions are all different, and the belt-like regions of the patterned optical anisotropic layer of the first phase difference plate and the belt-like regions of the patterned optical anisotropic layer of the second phase difference plate are disposed to intersect with each other in a plane direction, and the first phase difference plate, the second phase difference plate, and the polarizing plate are laminated in this order.

In the optical laminated film according to the invention, it is preferable that the patterned optical anisotropic layer of the first phase difference plate and the patterned optical anisotropic layer of the second phase difference plate repeatedly have the same unit in an arrangement direction of the belt-like regions.

It is preferable that in the patterned optical anisotropic layer of the first phase difference plate and the patterned optical anisotropic layer of the second phase difference plate, the slow axis direction of the belt-like regions in the unit sequentially change toward an arrangement direction of the belt-like regions.

It is preferable that the belt-like regions of the patterned optical anisotropic layer of the first phase difference plate and the belt-like regions of the patterned optical anisotropic layer of the second phase difference plate be perpendicular to each other in the plane direction.

It is preferable that the first phase difference plate and the second phase difference plate be different phase difference plates.

It is preferable that one of the first phase difference plate and the second phase difference plate be a $\lambda/4$ plate, and the other be a $\lambda/2$ plate.

It is preferable that in the patterned optical anisotropic layer of the first phase difference plate and the patterned optical anisotropic layer of the second phase difference plate, the slow axis direction of the belt-like regions in the unit change from 0° to 180° with respect to an arrangement direction of the belt-like regions.

It is preferable that the patterned optical anisotropic layer of the first phase difference plate and the patterned optical anisotropic layer of the second phase difference plate contain a liquid crystal compound.

Provided is a polarization imaging sensor according to the invention comprising: the optical laminated film according to the invention; and an image sensor.

According to the invention, it is possible to detect a polarization state of incident light with a simple configuration using a component which is superior in productivity and has high versatility.

DESCRIPTION OF THE PREFERRED EMBODIMENTS

Hereinafter, an optical laminated film and a polarization imaging sensor according to the invention will be described in detail based on suitable examples illustrated in the accompanying drawings.

In this specification, a numerical value range expressed using "to" means a range including numerical values before and after "to" as a lower limit value and an upper limit value.

In this specification, the terms "perpendicular" and "parallel" include an acceptable error range in the technical field of the invention. For example, the terms "perpendicular" and "parallel" include directions within a range of exact perpendicular or parallel±less than 10°, and an error of the exact perpendicular or parallel is preferably not greater than 5°, and more preferably not greater than 3°.

In addition, angles shown other than the terms "perpendicular" and "parallel", e.g., specific angles such as 15° and 45°, also include an acceptable error range in the technical field of the invention. For example, in the invention, an angle includes angles within a range of an exact angle indicated concretely±less than 5°, and an error of the indicated exact angle is preferably not greater than ±3°, and more preferably not greater than ±1°.

Re ($\lambda$) represents in-plane retardation at a wavelength $\lambda$. Re ($\lambda$) is measured by making light having a wavelength of $\lambda$ nm incident in a normal direction of a film in Axometry manufactured by Axometrics, Inc. In this specification, the measurement wavelength is 550 nm in a case where there is no particular note for the measurement wavelength.

Figure 1:
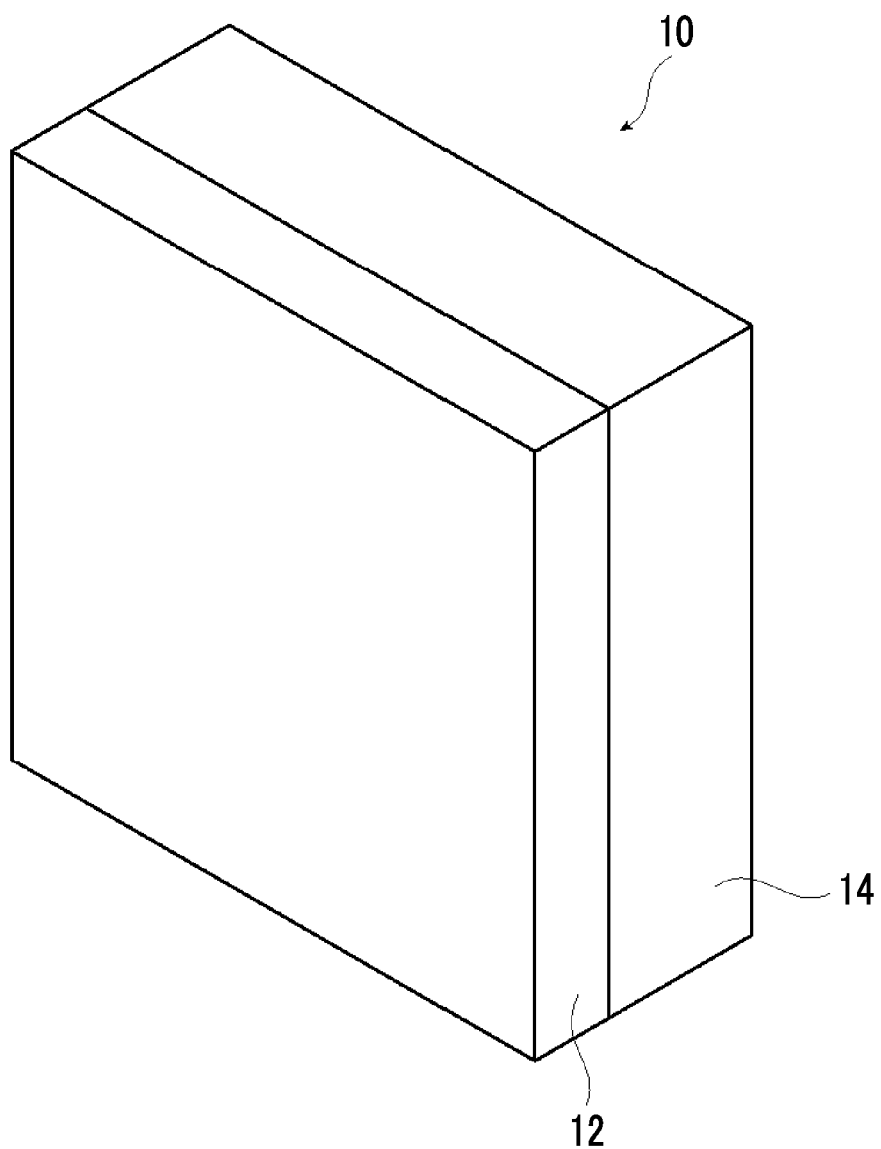
FIG. 1 is a perspective view schematically illustrating an example of a polarization imaging sensor according to the invention.

FIG. 1 illustrates a schematic perspective view of an example of a polarization imaging sensor according to the invention using an optical laminated film according to the invention.

Figure 2:
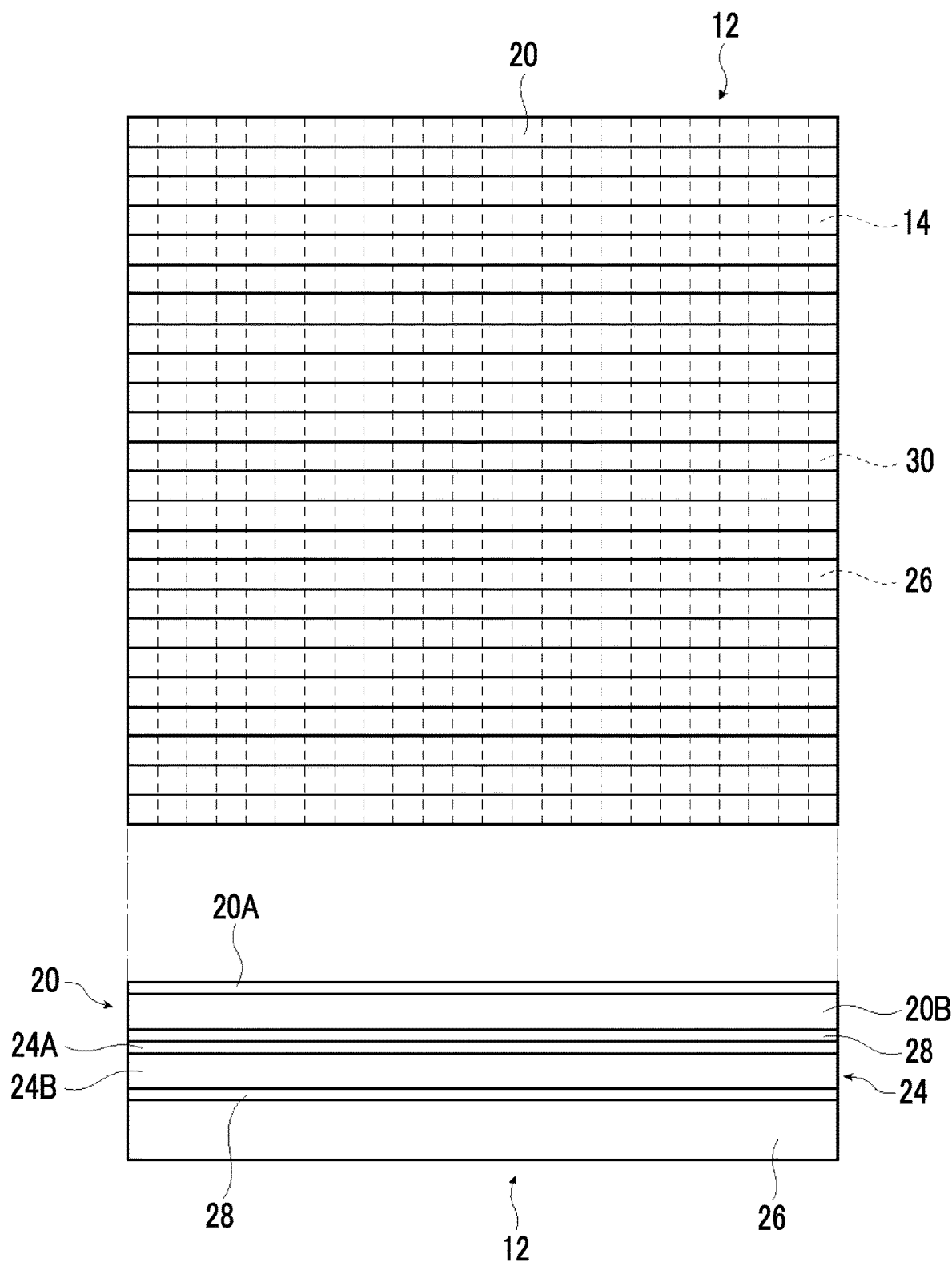
FIG. 2 shows a front view and a side view schematically illustrating a polarization detection filter of the polarization imaging sensor illustrated in FIG. 1.

Basically, a polarization imaging sensor 10 illustrated in FIG. 1 is configured to have a polarization detection filter 12 and an image sensor 14. The polarization detection filter 12 is an optical laminated film according to the invention. As schematically illustrated in FIG. 2, the polarization detection filter 12 has a first phase difference plate 20, a second phase difference plate 24, and a polarizing plate 26.

The polarization imaging sensor 10 performs photometry of light incident on and transmitted through the polarization detection filter 12 using the image sensor 14 to detect a polarization state of the incident light.

As the image sensor 14, any known image sensor in which light-receiving elements (photoelectric conversion elements) are two-dimensionally arranged can be used, such as a charge-coupled device (CCD) sensor, a complementary metal oxide semiconductor (CMOS) sensor, or a photodiode.

In the polarization imaging sensor 10 illustrated in FIG. 1, the polarization detection filter 12 and the image sensor 14 are disposed to come into close contact with each other, but the invention is not limited thereto.

For example, a known optical system may be disposed between the polarization detection filter 12 and the image sensor 14 to image light transmitted through the polarization detection filter 12 on a light-receiving surface of the image sensor 14, or to enlarge or contract light transmitted through the polarization detection filter 12.

FIG. 2 schematically illustrates an example of the polarization detection filter 12 according to the invention. In FIG. 2, the drawing on the upper side is a front view, and the drawing on the lower side is a side view. The front view is a view of the polarization detection filter 12 viewed from a side on which light to be measured is incident. In addition, FIG. 2 schematically illustrates an example of the polarization detection filter 12 according to the invention, and the number of belt-like regions (the number of units formed of a plurality of belt-like regions) to be described later is not limited to the number shown in FIG. 2.

As illustrated in FIG. 2, the polarization detection filter 12 has the first phase difference plate 20, the second phase difference plate 24, and the polarizing plate 26. The polarization detection filter 12 has a configuration in which the first phase difference plate 20, the second phase difference plate 24, and the polarizing plate 26 are laminated in this order from the light incidence surface side and bonded by bonding layers 28.

In the example illustrated in the drawing, for example, the first phase difference plate 20 is a $\lambda/4$ plate having a patterned optical anisotropic layer 20A and a support 20B. The second phase difference plate 24 is a $\lambda/2$ plate having a patterned optical anisotropic layer 24A and a support 24B. The polarizing plate 26 is a linear polarizing plate.

The first phase difference plate 20 may not have the support 20B depending on the forming material of the patterned optical anisotropic layer 20A. Similarly, the second phase difference plate 24 may not have the support 24B depending on the forming material of the patterned optical anisotropic layer 24A.

The bonding layer 28 is used for bonding between the first phase difference plate 20 and the second phase difference plate 24, and between the second phase difference plate 24 and the polarizing plate 26.

As the bonding layer 28, those formed of various known materials can be used as long as these bond plate-like target materials (sheet-like materials) to each other. The bonding layer may be a layer formed of an adhesive which has fluidity during bonding, and then becomes a solid, a layer formed of a pressure sensitive adhesive which is a gel-like (rubber-like) soft solid during bonding, and thereafter does not change from its gel-like state, or a layer formed of a material having characteristics of both of an adhesive and a pressure sensitive adhesive. Accordingly, as the bonding layer 28, a known one which is used for bonding of a sheet-like material in optical devices and optical elements, such as an optical clear adhesive (OCA), an optical transparent double-faced tape, an ultraviolet curable resin, or the like, may be used.

Otherwise, without bonding using the bonding layer 28, the first phase difference plate 20, the second phase difference plate 24, and the polarizing plate 26 may be laminated and held by a frame, a holding device, or the like to constitute the optical laminated film according to the invention.

Figure 3:
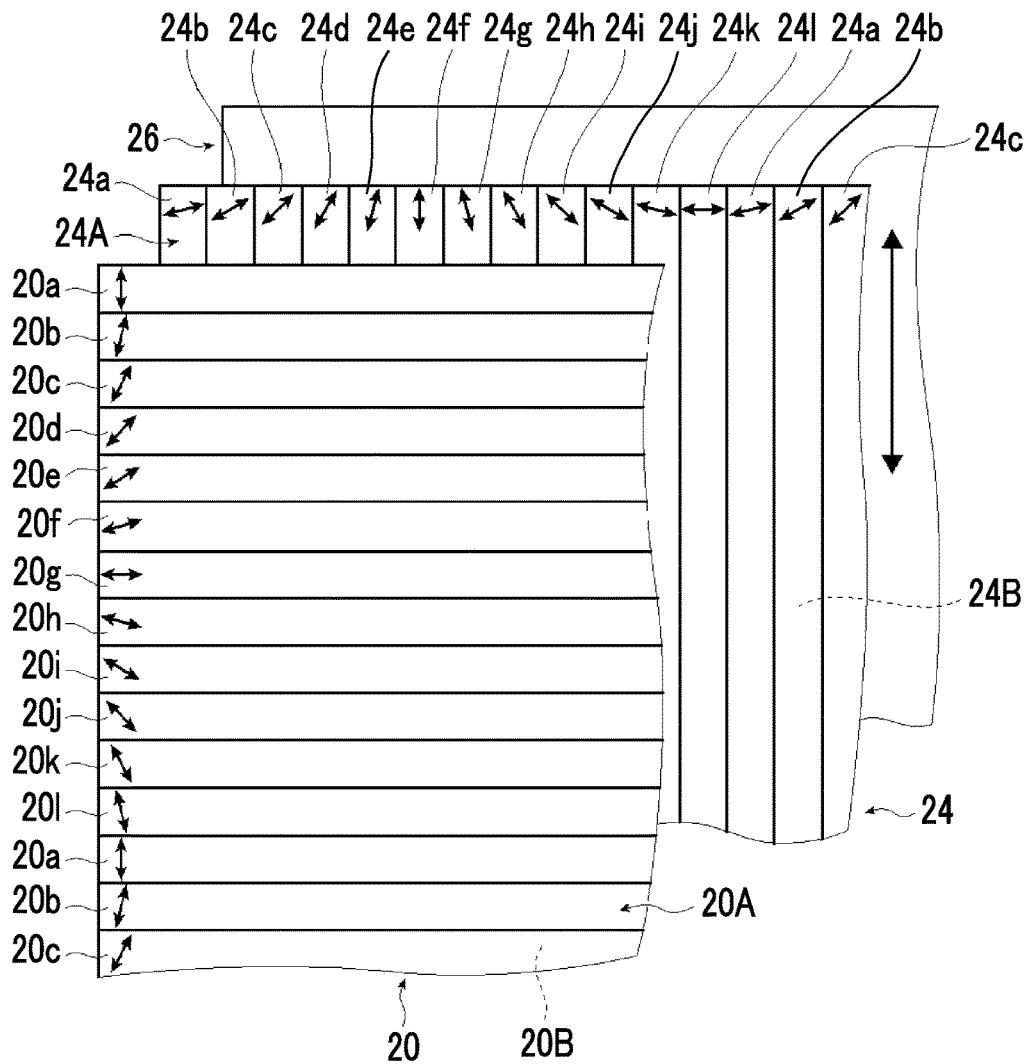
FIG. 3 is a schematic exploded view of the polarization detection filter illustrated in FIG. 2.

FIG. 3 illustrates an exploded view of the polarization detection filter 12.

As illustrated in FIG. 3, in the patterned optical anisotropic layer 20A of the first phase difference plate 20, the slow axis is divided into a plurality of belt-like regions in the same plane. Specifically, the patterned optical anisotropic layer 20A has 12 belt-like regions of first to twelfth belt-like regions 20a to 20l, which are linear regions having the same width. In FIG. 3, the arrow of each belt-like region represents a slow axis direction of the patterned optical anisotropic layer 20A and the patterned optical anisotropic layer 24A.

The first phase difference plate 20 is a λ/4 plate, and the phase difference between the first to twelfth belt-like regions 20a to 20l of the patterned optical anisotropic layer 20A is constant. However, the respective belt-like regions have different slow axis directions. That is, the patterned optical anisotropic layer 20A of the first phase difference plate 20 has such patterned optical anisotropy that it is divided into a plurality of belt-like regions having different slow axis directions.

In the example illustrated in the drawing, in the first to twelfth belt-like regions 20a to 20l of the patterned optical anisotropic layer 20A of the first phase difference plate 20, the slow axis changes from 0° to 180° at intervals of 15° with respect to an arrangement direction of the belt-like regions, that is, a direction perpendicular to a longitudinal direction of the belt-like regions. 0° is equal to 180°.

In the following description, the "arrangement direction of the belt-like regions" may be referred to as a "reference direction" in the first phase difference plate 20 and the second phase difference plate 24.

That is, in the first phase difference plate 20, the first belt-like region 20a has a slow axis inclined at 0° with respect to the reference direction. The second belt-like region 20b has a slow axis inclined at 15° with respect to the reference direction. The third belt-like region 20c has a slow axis inclined at 30° with respect to the reference direction. The fourth belt-like region 20d has a slow axis inclined at 45° with respect to the reference direction. The fifth belt-like region 20e has a slow axis inclined at 60° with respect to the reference direction. The sixth belt-like region 20f has a slow axis inclined at 75° with respect to the reference direction. The seventh belt-like region 20g has a slow axis inclined at 90° with respect to the reference direction. The eighth belt-like region 20h has a slow axis inclined at 105° with respect to the reference direction. The ninth belt-like region 20i has a slow axis inclined at 120° with respect to the reference direction. The tenth belt-like region 20j has a slow axis inclined at 135° with respect to the reference direction. The eleventh belt-like region 20k has a slow axis inclined at 150° with respect to the reference direction. The twelfth belt-like region 20l has a slow axis inclined at 165° with respect to the reference direction.

The patterned optical anisotropic layer 20A of the first phase difference plate 20 has 12 belt-like regions of first to twelfth belt-like regions 20a to 20l as one unit, and has a configuration in which a plurality of units, each formed of first to twelfth belt-like regions 20a to 20l, are repeatedly formed in the reference direction.

In the invention, the number of belt-like regions constituting one unit is not limited to 12 in the example illustrated in the drawing, and may be appropriately set in accordance with an angular difference or the like between slow axes of belt-like regions adjacent to each other to be described later. In addition, in the invention, in the patterned optical anisotropic layer 20A, the slow axis direction preferably changes from 0° to 180° in one unit as in the example illustrated in the drawing. These are the same as in the patterned optical anisotropic layer 24A of the second phase difference plate 24.

As illustrated in FIG. 3, in the patterned optical anisotropic layer 24A of the second phase difference plate 24, the slow axis is also divided into a plurality of belt-like regions in the same plane. Specifically, the patterned optical anisotropic layer 24A has 12 belt-like regions of first to twelfth belt-like regions 24a to 24l, which are linear regions having the same width.

The second phase difference plate 24 is a plate, and the phase difference between the first to twelfth belt-like regions 24a to 24l of the patterned optical anisotropic layer 24A is constant. However, the slow axis directions are all different in the belt-like regions. That is, the second phase difference plate 24 also has such patterned optical anisotropy that the slow axis is divided into belt-like regions.

In the example illustrated in the drawing, in the first to twelfth belt-like regions 24a to 24l of the patterned optical anisotropic layer 24A of the second phase difference plate 24, the slow axis also changes from 0° to 180° at intervals of 15° with respect to a reference direction (an arrangement direction of the belt-like regions).

That is, in the second phase difference plate 24, the first belt-like region 24a has a slow axis inclined at 0° with respect to the reference direction. The second belt-like region 24b has a slow axis inclined at 15° with respect to the reference direction. The third belt-like region 24c has a slow axis inclined at 30° with respect to the reference direction. The fourth belt-like region 24d has a slow axis inclined at 45° with respect to the reference direction. The fifth belt-like region 24e has a slow axis inclined at 60° with respect to the reference direction. The sixth belt-like region 24f has a slow axis inclined at 75° with respect to the reference direction. The seventh belt-like region 24g has a slow axis inclined at 90° with respect to the reference direction. The eighth belt-like region 24h has a slow axis inclined at 105° with respect to the reference direction. The ninth belt-like region 24i has a slow axis inclined at 120° with respect to the reference direction. The tenth belt-like region 24j has a slow axis inclined at 135° with respect to the reference direction. The eleventh belt-like region 24k has a slow axis inclined at 150° with respect to the reference direction. The twelfth belt-like region 24l has a slow axis inclined at 165° with respect to the reference direction.

The patterned optical anisotropic layer 24A of the second phase difference plate 24 has 12 belt-like regions of first to twelfth belt-like regions 24a to 24l as one unit, and has a configuration in which a plurality of units, each formed of first to twelfth belt-like regions 24a to 24l, are repeatedly formed in the reference direction.

The polarizing plate 26 is a linear polarizing plate having a polarization axis in one direction, and a general linear polarizing plate, such as an absorption-type polarizing plate containing an iodine compound or a reflection-type polarizing plate such as a wire grid, can be used. The polarization axis is synonymous with a transmission axis.

In the example illustrated in the drawing, for example, the polarizing plate 26 has a polarization axis coinciding with the reference direction of the first phase difference plate 20 as shown by the arrow in the polarizing plate 26.

As illustrated in FIG. 2, for example, the first phase difference plate 20, the second phase difference plate 24, and the polarizing plate 26 of the polarization detection filter 12 in the example illustrated in the drawing have a square planar shape, and their sizes are the same. In addition, the belt-like regions have the same width in the first phase difference plate 20 and the second phase difference plate 24.

Furthermore, as illustrated in FIGS. 2 and 3, the first phase difference plate 20 and the second phase difference plate 24 are disposed such that the belt-like regions of the patterned optical anisotropic layers thereof are perpendicular to each other. That is, the first phase difference plate 20 and the second phase difference plate 24 are disposed such that the reference directions thereof are perpendicular to each other. Accordingly, one belt-like region of the first phase difference plate 20 repeatedly intersects with all of the first to twelfth belt-like regions 24a to 24l of the second phase difference plate 24. One belt-like region of the second phase difference plate 24 repeatedly intersects with all of the first to twelfth belt-like regions 20a to 20l of the first phase difference plate 20.

Accordingly, the polarization detection filter 12 has a state in which by one unit of the first phase difference plate 20 and one unit of the second phase difference plate 24, 144 rectangular regions formed by intersection of the first to twelfth belt-like regions 20a to 20l of the first phase difference plate 20 and the first to twelfth belt-like regions 24a to 24l of the second phase difference plate 24 are formed in a plane direction when viewed from the front, that is, from a light incidence direction.

In the following description, one rectangular region formed by intersection of one belt-like region of the first phase difference plate 20 and one belt-like region of the second phase difference plate 24 is also referred to as an "intersection region".

In the polarization imaging sensor 10, one or more light-receiving elements of the image sensor 14 receive light passing through an intersection region and perform photometry.

As described above, in the patterned optical anisotropic layer 20A of the first phase difference plate 20 of the polarization detection filter 12 of the polarization imaging sensor 10, units each formed of 12 belt-like regions of first to twelfth belt-like regions 20a to 20l are repeatedly formed in the reference direction. In addition, in the patterned optical anisotropic layer 24A of the second phase difference plate 24 of the polarization detection filter 12, units each formed of 12 belt-like regions of first to twelfth belt-like regions 24a to 24l are repeatedly formed in the reference direction.

In the polarization imaging sensor 10 (polarization detection filter 12), one pixel of the polarization imaging sensor 10 is formed by one unit of the patterned optical anisotropic layer 20A of the first phase difference plate 20 and one unit of the patterned optical anisotropic layer 24A of the second phase difference plate 24 which are laminated to intersect with each other. That is, in the example illustrated in the drawing, one pixel of the polarization imaging sensor 10 is formed by 144 intersection regions of 12×12, formed by intersection of the first to twelfth belt-like regions 20a to 20l of the first phase difference plate 20 and the first to twelfth belt-like regions 24a to 24l of the second phase difference plate 24.

Accordingly, in the polarization imaging sensor 10, in accordance with the number of pixels of the image sensor 14, the number of repetitions of the units in the first phase difference plate 20 and the second phase difference plate 24 (the number of units in the patterned optical anisotropic layer), and the length of a belt-like region, the number of pixels capable of detecting polarization is determined, and a polarization detection image is obtained.

As described above, the first phase difference plate 20 is a λ/4 plate, and the first to twelfth belt-like regions 20a to 20l of the patterned optical anisotropic layer 20A have different slow axis directions. In addition, the second phase difference plate 24 is a λ/2 plate, and similarly, the first to twelfth belt-like regions 24a to 24l of the patterned optical anisotropic layer 24A have different slow axis directions.

Accordingly, in one pixel of the polarization imaging sensor 10, all 144 intersection regions formed in the plane are different from each other in the combination of a slow axis of the first phase difference plate 20 and a slow axis of the second phase difference plate.

Therefore, in a case where rays of light having the same polarization state are incident on one pixel of the polarization detection filter 12 and transmitted through the first phase difference plate 20 and the second phase difference plate 24, the light become polarized light according to the combination of the slow axes of the intersection regions through which the light is transmitted. That is, the light transmitted through the first phase difference plate 20 and the second phase difference plate 24 is converted into at most 144 different kinds of polarized light in the plane direction in accordance with the intersection regions through which the light is transmitted.

In a case where at most 144 kinds of polarized light having different polarization states are transmitted through the polarizing plate 26 which is a linear polarizing plate, the transmitted light intensity becomes a light intensity according to the polarization state of each light and the polarization axis direction of the polarizing plate 26, and a light intensity distribution is formed.

The polarization state of the light transmitted through the first phase difference plate 20 and the second phase difference plate 24 varies depending on the polarization state of the light incident on the polarization detection filter 12. That is, the light intensity distribution of the light incident on one pixel of the polarization detection filter 12 and transmitted through the first phase difference plate 20, the second phase difference plate 24, and the polarizing plate 26 has a specific pattern according to the polarization state of the light incident on the polarization detection filter 12.

Accordingly, in a case where the light incident on one pixel of the polarization detection filter 12 and transmitted through the polarizing plate 26 is subjected to photometry of the image sensor 14 such as a CCD sensor and reproduced as a monochrome image or color image, and a density pattern (color density pattern) is detected, the polarization state of the light incident on one pixel of the polarization detection filter 12 can be detected. For example, previously, in a case where light having various kinds of polarization states is made incident on one pixel of the polarization detection filter 12, the light intensity is measured by the image sensor 14, or simulated and/or calculated to known a density variation pattern corresponding to the polarization state, and this pattern is provided as a table, the polarization state of the light incident on one pixel of the polarization detection filter 12 can be detected.

As described above, the patterned optical anisotropic layers of the first phase difference plate 20 and the second phase difference plate 24 in the polarization imaging sensor 10 have 12 belt-like regions as one unit, and 144 intersection regions of 12×12 which are positions where one belt-like region of the second phase difference plate 24 and one belt-like region of the first phase difference plate 20 in one unit intersect with each other correspond to one pixel. In the polarization detection filter 12, since the unit formed of 12 belt-like regions is repeatedly formed in the reference direction, the polarization state can be measured two-dimensionally.

That is, the polarization imaging sensor 10 can measure a polarization state at each position, a difference in the polarization state by position, and the like by single polarization.

That is, according to the polarization detection filter 12 which is an optical laminated film according to the invention, and the polarization imaging sensor 10 according to the invention, a polarization state of incident light can be detected with a simple lamination configuration using components which are superior in productivity and have high versatility, such as two phase difference plates having such patterned optical anisotropy that the slow axis is divided into a plurality of belt-like regions, and a general linear polarizing plate not subjected to polarization axis pattering or the like.

In both the patterned optical anisotropic layer 20A of the first phase difference plate 20 and the patterned optical anisotropic layer 24A of the second phase difference plate 24 in the example illustrated in the drawing, the slow axis direction of belt-like regions changes sequentially (continuously) toward a reference direction (arrangement direction of the regions) by 15° with respect to the reference direction in one unit. However, the invention is not limited thereto.

That is, in the patterned optical anisotropic layers of the first phase difference plate 20 and the second phase difference plate 24, the angular difference between slow axis directions of belt-like regions adjacent to each other in one unit may be greater than or less than 15°.

In addition, in the patterned optical anisotropic layers of the first phase difference plate 20 and the second phase difference plate 24, the angle of the slow axis direction of a belt-like region in one unit may not be changed at a constant width such as an interval of 15°, but may be changed to 5°→10°→20° . . . toward the reference direction at a different angle. In the patterned optical anisotropic layers of the first phase difference plate 20 and the second phase difference plate 24, the angle of the slow axis direction of a belt-like region in one unit may not be sequentially changed to 0°→15°→30° . . . as in the example illustrated in the drawing, but may be randomly changed to 0°→60°→15° . . . such that the slow axis angles do not overlap each other.

The smaller the angular difference (interval width of angle) between slow axis directions of belt-like regions adjacent to each other in one unit, the higher the accuracy of the detection of polarization. In contrast, as described above, since one intersection region of the polarization detection filter 12 corresponds to one or more light-receiving elements of the image sensor in the polarization imaging sensor 10, and one pixel of the polarization imaging sensor 10 is formed by one unit of the first phase difference plate 20 and one unit of the second phase difference plate 24, the smaller the angular difference between slow axis directions of belt-like regions adjacent to each other, the lower the spatial resolution of the polarization imaging sensor 10.

Accordingly, the angular difference between slow axis directions of the belt-like regions of the first phase difference plate 20 and the second phase difference plate 24 may be appropriately set in accordance with the polarization detection accuracy and the spatial resolution required for the polarization imaging sensor 10.

According to the examination of the inventors, in one unit, the angular difference between slow axis directions of belt-like regions adjacent to each other in the reference direction of the first phase difference plate 20 and the second phase difference plate 24 is preferably within 5°, more preferably within 2°, and even more preferably less than 1°. In addition, the angle of the slow axis direction of each belt-like region of the first phase difference plate 20 and the second phase difference plate 24 preferably changes sequentially (continuously) toward the reference direction at regular intervals in one unit.

With a configuration in which the angular difference between slow axes of belt-like regions adjacent to each other in the reference direction of the first phase difference plate 20 and the second phase difference plate 24 is within 5°, and the angle of the slow axis direction sequentially changes toward the reference direction with the same angular difference, the polarization detection cab be performed with extremely high accuracy, and pattern analysis for an output image of the image sensor 14 according to the polarization can be facilitated.

In a case where the above-described conditions are satisfied, the light intensity distribution does not change even in a case where a positional deviation occurs between the first phase difference plate 20 and the second phase difference plate 24. Therefore, even in a case where a positional deviation occurs between the polarization detection filter 12 and the image sensor 14, the entire light intensity distribution deviates only, and a reduction in the polarization detection accuracy can be suppressed as less as possible. In other words, in a case where the above-described conditions are satisfied, the burden applied to the alignment of the first phase difference plate 20 and the second phase difference plate 24 and the alignment of the polarization detection filter 12 and the image sensor 14 can be significantly reduced.

In the polarization imaging sensor 10 in the example illustrated in the drawing, in both the first phase difference plate 20 having first to twelfth belt-like regions 20a to 20l as a unit and the second phase difference plate 24 having first to twelfth belt-like regions 24a to 24l as a unit, the same units are repeatedly formed, but the invention is not limited thereto.

That is, the first phase difference plate 20 and/or the second phase difference plate 24 may include different units.

For example, a configuration may be employed in which in the first phase difference plate 20 and/or the second phase difference plate 24, the angle of the slow axis with respect to the reference direction changes at intervals of 15° in a certain unit as in the example illustrated in the drawing, changes at intervals of 30° in another unit, and changes at intervals of 7.5° in still another unit. Otherwise, a configuration may be employed in which in the first phase difference plate 20 and/or the second phase difference plate 24, a certain unit has 12 belt-like regions as in the example illustrated in the drawing, another unit has 30 belt-like regions, and still another unit has 45 belt-like regions.

As described above, in the polarization imaging sensor 10, one or more light-receiving elements of the image sensor 14 performs photometry of light transmitted through one intersection region.

Accordingly, the width of a belt-like region in the first phase difference plate 20 and the second phase difference plate 24 is preferably equal to or an integral multiple of the size of a light-receiving element of the image sensor 14.

In addition, the pixel pitch or the width of a belt-like region in the first phase difference plate 20 and the second phase difference plate 24 for a case where an optical system is provided between the polarization detection filter 12 and the image sensor 14 may be appropriately set in accordance with the optical system to be disposed, in addition to the size of a light-receiving element of the image sensor 14.

In view of the fact that since one light-receiving element of a general image sensor has a square shape, a pixel of the image sensor easily corresponds to an intersection region, the widths of all belt-like regions in the first phase difference plate 20 and the second phase difference plate 24 are preferably the same. However, belt-like regions having different widths may be formed.

The widths of belt-like regions may be the same or different in the first phase difference plate 20 and the second phase difference plate 24.

The number of belt-like regions, the number of belt-like regions constituting one unit, and the number of units constituting a patterned optical anisotropic layer may be the same or different in the first phase difference plate 20 and the second phase difference plate 24.

As described above, the first phase difference plate 20 is a $\lambda/4$ plate. A $\lambda/4$ plate (plate having a $\lambda/4$ function) is a plate functioning to convert linearly polarized light having a specific wavelength into circularly polarized light (or converting circularly polarized light into linearly polarized light). More specifically, the $\lambda/4$ plate is a plate in which an in-plane retardation value at a predetermined wavelength of $\lambda$ nm is represented by Re $(\lambda)=\lambda/4$ (or an odd multiple thereof). This formula may be achieved at any wavelength (for example, 550 nm) in a visible light region. The fact that the first phase difference plate 20 is a $\lambda/4$ plate means that combinations of the respective belt-like regions of the patterned optical anisotropic layer 20A of the first phase difference plate 20 and the support 20B are all $\lambda/4$ plates.

In each belt-like region of the patterned optical anisotropic layer 20A of the first phase difference plate 20, an in-plane retardation Re (550) at a wavelength of 550 nm is not particularly limited, but preferably 115 to 165 nm, more preferably 120 to 150 nm, and even more preferably 125 to 145 nm. Even in a case where the first phase difference plate 20 includes a layer other than the patterned optical anisotropic layer 20A, such as the support 20B, the in-plane retardation is preferably within the above range in the entire first phase difference plate 20.

In addition, the second phase difference plate 24 is a $\lambda/2$ plate. A $\lambda/2$ plate is a plate in which an in-plane retardation Re $(\lambda)$ at a specific wavelength of nm satisfies the formula Re $(\lambda)=\lambda/2$. This formula may be achieved at any wavelength (for example, 550 nm) in a visible light region. The fact that the second phase difference plate 24 is a $\lambda/2$ plate means that combinations of the respective belt-like regions of the patterned optical anisotropic layer 24A of the second phase difference plate 24 and the support 24B are all $\lambda/2$ plates.

In each belt-like region of the patterned optical anisotropic layer 24A of the second phase difference plate 24, an in-plane retardation Re (550) at a wavelength of 550 nm is not particularly limited, but preferably 255 to 295 nm, more preferably 260 to 290 nm, and even more preferably 265 to 285 nm. Similarly, even in a case where the second phase difference plate 24 includes a layer other than the patterned optical anisotropic layer 24A, such as the support 24B, the in-plane retardation is preferably within the above range in the entire second phase difference plate 24.

In the polarization detection filter 12 in the example illustrated in the drawing, the first phase difference plate 20 on the light incidence side is a $\lambda/4$ plate, and the second phase difference plate is a $\lambda/2$ plate. However, the invention is not limited thereto.

That is, the first phase difference plate 20 on the light incidence side may be a $\lambda/2$ plate, and the second phase difference plate 24 may be a $\lambda/4$ plate. Otherwise, the first phase difference plate 20 and the second phase difference plate 24 may be the same phase difference plates. For example, both the first phase difference plate 20 and the second phase difference plate 24 may be $\lambda/4$ plates. Otherwise, a phase difference plate other than a $\lambda/4$ plate and a $\lambda/2$ plate, such as a $\lambda/8$ plate or a $\lambda/8$ plate, may be used as the first phase difference plate 20 and the second phase difference plate 24.

According to the examination of the inventors, the in-plane retardation Re of the first phase difference plate 20 is preferably $\lambda/8$ to $3\lambda/8$, and the in-plane retardation Re of the second phase difference plate 24 is preferably greater than that of the first phase difference plate 20 in view of increasing the detection accuracy.

The patterned optical anisotropic layer 20A of the first phase difference plate 20 and the patterned optical anisotropic layer 24A of the second phase difference plate 24 preferably contain a liquid crystal compound.

In a case where the patterned optical anisotropic layer 20A of the first phase difference plate 20 and the patterned optical anisotropic layer 24A of the second phase difference plate 24 contain a liquid crystal compound, the width of a belt-like region and a slow axis direction in a belt-like region can be controlled with high accuracy and high resolution. For example, an angular difference between slow axes in belt-like regions adjacent to each other can be easily adjusted to be less than 1°.

Examples of the method of forming a patterned optical anisotropic layer containing a liquid crystal compound include a method of fixing a liquid crystal compound in an alignment state. In this case, preferable examples of the method of fixing a liquid crystal compound include a method in which as the liquid crystal compound, a liquid crystal compound having an unsaturated double bond (polymerizable group) is used and fixed by polymerization. Examples thereof include a method including: applying a patterned optical anisotropic layer forming composition containing a liquid crystal compound having an unsaturated double bond (polymerizable group) to a support directly or via an alignment film; curing (polymerization) the composition by ionizing radiation irradiation to fix the liquid crystal compound. The patterned optical anisotropic layer may have a single layer structure or a lamination structure.

The type of the unsaturated double bond contained in the liquid crystal compound is not particularly limited. A functional group which can be subjected to an addition polymerization reaction is preferable, and a polymerizable ethylenically unsaturated group or a cyclic polymerizable group is more preferable. More specifically, a (meth)acryloyl group, a vinyl group, a styryl group, an allyl group, or the like is preferable, and a (meth)acryloyl group is more preferable.

In general, liquid crystal compounds can be classified into a rod-like type and a disk-like type according to the shape thereof. Further, each type includes a low molecular type and a high molecular type. The term high molecular generally refers to a compound having a degree of polymerization of 100 or greater (Polymer Physics-Phase Transition Dynamics, written by Masao Doi, p. 2, published by Iwanami Shoten, 1992). In the invention, any type of liquid crystal compound can be used. Two or more types of rod-like liquid crystal compounds, two or more types of disk-like liquid crystal compounds, or a mixture of a rod-like liquid crystal compound and a disk-like liquid crystal compound may be used. In order to fix the above-described liquid crystal compound, a rod-like liquid crystal compound or disk-like liquid crystal compound having a polymerizable group is preferably used for forming a patterned optical anisotropic layer. The liquid crystal compound preferably has two or more polymerizable groups in one molecule. In a case of a mixture of two or more types of liquid crystal compounds, at least one type of liquid crystal compound preferably has two or more polymerizable groups in one molecule.

As the rod-like liquid crystal compound, for example, those described in claim 1 of JP1999-513019A (JP-H11-513019A) or paragraphs [0026] to [0098] of JP2005-289980A can be preferably used, and as the discotic liquid crystal compound, for example, those described in paragraphs [0020] to [0067] of JP2007-108732A or paragraphs [0013] to [0108] of JP2010-244038A can be preferably used, but the liquid crystal compounds are not limited thereto.

The alignment state of the liquid crystal compound may be controlled to adjust the in-plane retardation in the patterned optical anisotropic layer within the above range. In this case, in a case where a rod-like liquid crystal compound is used, the rod-like liquid crystal compound is preferably fixed in a state of being horizontally aligned, and in a case where a discotic liquid crystal compound is used, the discotic liquid crystal compound is preferably fixed in a state of being vertically aligned. In the invention, the expression "the rod-like liquid crystal compound is horizontally aligned" is that a director of the rod-like liquid crystal compound is parallel to a layer surface, and the expression "the discotic liquid crystal compound is vertically aligned" is that a disc plane of the discotic liquid crystal compound is vertical to a layer surface. These do not require exact horizontal or vertical alignment, but mean that the angle formed between the liquid crystal compound and a layer surface is within a range of accurate angle ±20°. The range from an accurate angle is preferably within ±5°, more preferably within ±3°, even more preferably within ±2°, and most preferably within ±10°.

An additive (alignment control agent) promoting horizontal alignment or vertical alignment may be used to horizontally or vertically align the liquid crystal compound. As the additive, various known additives can be used.

Examples of the method of forming the above-described patterned optical anisotropic layer include the following preferable aspects, but are not limited thereto. The patterned optical anisotropic layer can be formed using various known methods.

A first preferable aspect is a method in which a plurality of actions are used to control the alignment of the liquid crystal compound, and then any one of the actions is eliminated by an external stimulus (heat treatment or the like) to make a predetermined alignment control action predominant. In the above-described method, for example, by a composite action of alignment controllability resulting from an alignment film and alignment controllability of an alignment control agent added to the liquid crystal compound, the liquid crystal compound is in a predetermined alignment state and fixed, and thus one phase difference region is formed. Thereafter, by an external stimulus (heat treatment or the like), any one of the actions (for example, action resulting from the alignment control agent) is eliminated such that the other alignment control action (action resulting from the alignment film) becomes predominant. In this manner, the liquid crystal compound is in the other alignment state and fixed, and thus the other phase difference region is formed. This method is specifically described in paragraphs [0017] to [0029] of JP2012-008170A, and the content of which is incorporated into the present specification as reference.

A second preferable aspect is an aspect in which a patterned alignment film is used. In this aspect, patterned alignment films having different types of alignment controllability are formed, and a liquid crystal compound is disposed on the films and aligned. The alignment state of the liquid crystal compound varies with the alignment controllability of each of the patterned alignment films. By fixing the respective alignment states, patterns of the belt-like regions of the patterned optical anisotropic layers of the first phase difference plate 20 and the second phase difference plate 24 are formed in accordance with the patterns of the alignment films. The patterned alignment film can be formed by means of a printing method, mask rubbing for a rubbing alignment film, mask exposure for a photo-alignment film, or the like. A method using mask exposure for a photo-alignment film or a method using a printing method is preferable, since large-scale equipment is not required and the manufacturing is easily performed. This method is specifically described in paragraphs [0166] to [0181] of JP2012-032661A, and the content of which is incorporated into the present specification as reference.

A third preferable aspect is, for example, an aspect in which a photo-acid generator is added to an alignment film. In this example, a photo-acid generator is added to an alignment film, and by pattern exposure, the photo-acid generator is decomposed. Thus, a region in which an acidic compound is generated and a region in which no acidic compound is generated are formed. In a portion not irradiated with light, the photo-acid generator is substantially undecomposed, the alignment state is controlled by the interaction of the material of the alignment film, the liquid crystal compound, and the alignment control agent which is added optionally, and the liquid crystal compound is aligned in a direction in which the slow axis thereof is perpendicular to a rubbing direction. In a case where the alignment film is irradiated with light and an acidic compound is generated, the interaction is no longer predominant, the alignment state is controlled by the rubbing direction of a rubbing alignment film, and the liquid crystal compound is aligned in parallel such that the slow axis thereof is parallel to the rubbing direction. As the photo-acid generator used for the alignment film, a water-soluble compound is preferably used. Examples of usable photo-acid generators include compounds described in Prog. Polym. Sci., vol. 23, p. 1485 (1998). As the photo-acid generator, pyridinium salts, iodonium salts, and sulfonium salts are particularly preferably used. This method is specifically described in JP2010-289360, and the content of which is incorporated into the present specification as reference.

The thickness of the patterned optical anisotropic layer is not particularly limited. The thickness is preferably 1 to 5 μm, more preferably 1 to 4 μm, and particularly preferably 1 to 3 μm in view of forming a thin first phase difference plate 20 and a thin second phase difference plate 24.

The phase difference plate used in the polarization detection filter 12 which is an optical laminated film according to the invention may include a layer other than the patterned optical anisotropic layer.

For example, in the polarization detection filter 12 in the example illustrated in the drawing, the first phase difference plate 20 has a transparent support 20B, and the second phase difference plate 24 has a transparent support 24B. That is, both the phase difference plates may have a configuration having a transparent support and a patterned optical anisotropic layer disposed on the support. The mechanical strength of the phase difference plate is improved by providing a support.

Examples of the material for forming the supports 20B and 24B include polycarbonate-based polymers, polyester-based polymers such as polyethylene terephthalate and polyethylene naphthalate, (meth)acrylic polymers such as polymethyl methacrylate, styrene-based polymers such as polystyrene and an acrylonitrile-styrene copolymer (AS resin), polyolefin-based polymers such as polyethylene, polypropylene, and an ethylene-propylene copolymer, amide-based polymers such as nylon and aromatic polyamide, imide-based polymers, sulfone-based polymers, polyethersulfone-based polymers, polyether ether ketone-based polymers, polyphenylene sulfide-based polymers, vinylidene chloride-based polymers, vinyl alcohol-based polymers, vinyl butyral-based polymers, arylate-based polymers, polyoxymethylene-based polymers, and epoxy-based polymers.

In addition, thermoplastic norbornene-based resins can be preferably used as a support forming material. Examples of the thermoplastic norbornene-based resins include ZEONEX and ZEONOR manufactured by ZEON CORPORATION, and ARTON manufactured by JSR Corporation.

Cellulose-based polymers (hereinafter, referred to as cellulose acylate), represented by triacetyl cellulose, can also be preferably used as a support forming material.

The thickness of the support is not particularly limited. The thickness is preferably 15 to 100 μm, more preferably 20 to 80 μm, and particularly preferably 40 to 60 μm in view of forming a thin first phase difference plate 20 and a thin second phase difference plate 24.

Various additives (for example, optical anisotropy adjuster, wavelength dispersion adjuster, fine particles, plasticizer, ultraviolet absorbing agent, deterioration inhibitor, release agent, and the like) can be added to the support.

In addition, an alignment film may be provided between the patterned optical anisotropic layer 20A and the support 20B of the first phase difference plate 20 and/or between the patterned optical anisotropic layer 24A and the support 24B of the second phase difference plate 24 as necessary. By providing an alignment film, the alignment direction of the liquid crystal compound in the patterned optical anisotropic layer is more easily controlled.

The alignment film generally contains a polymer as a main component. Regarding a polymer material for an alignment film, there are descriptions in many literatures, and many commercially available products are available. As a polymer material to be used, polyvinyl alcohols, polyimides, and derivatives thereof are preferable. Particularly, modified or unmodified polyvinyl alcohols are preferable. Regarding the alignment film which can be used in the invention, modified polyvinyl alcohols described in Line 24 of p. 43 to Line 8 of p. 49 of WO01/88574A1 or paragraphs [0071] to [0095] of JP3907735B can be referred to. In general, the alignment film is subjected to a known rubbing treatment. That is, in general, the alignment film is preferably a rubbed alignment film subjected to a rubbing treatment.

The thickness of the alignment film is preferably small. However, the alignment film is required to have a certain thickness from the viewpoint of imparting alignability for forming a patterned optical anisotropic layer and of forming a patterned optical anisotropic layer having a uniform film thickness by reducing surface unevenness of the support. Specifically, the thickness of the alignment film is preferably 0.01 to 10 μm, more preferably 0.01 to 1 μm, and even more preferably 0.01 to 0.5 μm.

In the invention, a photo-alignment film is also preferably used. The photo-alignment film is not particularly limited, and those described in paragraphs [0024] to [0043] of WO2005/096041A, LPP-JP265CP (trade name) manufactured by Rolic Technologies Ltd., and the like can be used.

Hereinafter, a preferable example of the method of manufacturing the first phase difference plate 20 and the second phase difference plate 24 using a photo-alignment film will be described with reference to the schematic view of FIG. 4. Since the methods of producing both the phase difference plates are the same, the first phase difference plate 20 is used as a representative example in the following description.

First, a composition for forming a photo-alignment film is applied to a surface of the support 20B by a known method such as spin coating and dried to form a photoisomerization composition layer L to be a photo-alignment film.

Next, the support 20B on which the photoisomerization composition layer L to be a photo-alignment film is formed is placed on a moving stage 30 which linearly moves in one direction.

Above the support 20B, a light screen 32 is fixed such that an end side thereof coincides with an end side of the support 20B and the support 20B is not covered. Accordingly, in a case where the moving stage 30 is moved toward the light screen 32, the support 20B (photoisomerization composition layer L) is hidden under the light screen 32 by a moving amount.

Above the light screen 32, a linear polarizing plate 34 such as a wire grid polarizing plate is rotatably provided with a center thereof as a rotation axis so as to face the support 20B. A known method using a UV (ultraviolet light)-permeable rotating stage or the like may be used to rotate the linear polarizing plate 34.

A light source is disposed so as to make light for aligning the photoisomerization composition layer L, for example, UV incident on the photoisomerization composition layer L through the linear polarizing plate 34.

In this state, first, the photoisomerization composition layer L is irradiated with UV through the linear polarizing plate 34. Due to the irradiation with UV, the photoisomerization composition layer L is aligned in accordance with a polarization axis direction of the linear polarizing plate 34.

Next, the linear polarizing plate 34 is rotated by a predetermined angle, for example, 1°, and the moving stage 30 is moved in a direction of the arrow x, that is, toward the light screen 32 by a distance which is the same as the width of a belt-like region. Accordingly, the photoisomerization composition layer L is UV-shielded by the light screen 32 by the width of a belt-like region. Then, the photoisomerization composition layer L is irradiated with UV again through the linear polarizing plate 34 so as to be aligned.

Next, similarly, the linear polarizing plate 34 is rotated by, for example, 1°, and the moving stage 30 is moved in the direction of the arrow x by a distance which is the same as the width of a belt-like region. The photoisomerization composition layer L is irradiated with UV again through the linear polarizing plate 34 so as to be aligned.

Similarly, the rotation of the linear polarizing plate 34 by a predetermined angle, the movement of the moving stage 30 in the direction of the arrow x, and the UV irradiation are repeatedly performed, and thus a photo-alignment film is formed on the surface of the support 20B.

In a case where the photo-alignment film is formed as described above, a liquid crystal composition to be a patterned optical anisotropic layer 20A is applied, dried, and cured by ultraviolet irradiation or the like to produce a first phase difference plate 20.

As is well known, the alignment of the photoisomerization composition to be a photo-alignment film accords to polarized light applied finally. Accordingly, in a case where a photo-alignment film is formed as described above to form a patterned optical anisotropic layer 20A, a patterned optical anisotropic layer 20A having a plurality of belt-like regions in which the slow axis direction changes sequentially can be formed as illustrated in FIG. 3.

As described above, the light transmitted through the first phase difference plate 20 and the second phase difference plate 24 passes through the polarizing plate 26 and is made on the image sensor 14, thereby being subjected to photometry.

The polarizing plate 26 may be a linear polarizing plate having a polarization axis in one direction and having a function of converting natural light into specific linearly polarized light, and an absorption-type polarizing plate can be used.

The kind of the polarizing plate 26 is not particularly limited, and as described above, various polarizing plates 26 which are generally used can be used. Accordingly, for example, any one of an iodine-based polarizing plate, a dye-based polarizing plate using a dichroic dye, and a polyene-based polarizing plate can be used. In general, an iodine-based polarizing plate and a dye-based polarizing plate are produced by adsorbing iodine or a dichroic dye to polyvinyl alcohol and performing stretching.

In the example illustrated in the drawing, the polarization axis of the polarizing plate 26 coincides with the reference direction (arrangement direction of belt-like regions) of the first phase difference plate 20 which is a λ/4 plate. However, in the invention, in a case where the direction of the polarization axis of the polarizing plate 26 is one direction, it may be, for example, either a direction perpendicular to the reference direction or a direction inclined at 45° with respect to the reference direction.

The light passing through the polarizing plate 26 is incident on the image sensor 14 and subjected to photometry. As described above, the image sensor 14 is a known image sensor in which light-receiving elements are two-dimensionally arranged, such as a CCD sensor, a CMOS sensor, or a photodiode sensor.

The polarization imaging sensor 10 according to the invention has many intersection regions which are formed by intersection of belt-like regions in the patterned optical anisotropic layers of the first phase difference plate 20 and the second phase difference plate 24, and the image sensor 14 performs the measurement for each intersection region. As described above, regarding the light-receiving elements of the image sensor 14, one element may correspond to one intersection region, or a plurality of elements may correspond to one intersection region. Accordingly, the number of light-receiving elements of the image sensor 14 is preferably equal to or greater than the total number of intersection regions of the polarization detection filter 12.

Although the optical laminated film and the polarization imaging sensor according to the invention have been specifically described as above, the invention is not limited to the above examples, and needless to say, the invention may include various modifications and improvements without departing from the gist of the invention.

EXAMPLES

Hereinafter, the invention will be more specifically described based on examples. Materials, reagents, used amounts, material amounts, ratios, treatment contents, treatment sequences, and the like shown in the following examples are able to be appropriately changed unless the changes cause deviance from the gist of the invention. Therefore, the range of the invention will not be restrictively interpreted by the following examples.

EXAMPLES

<Production of Support>
The following materials were put into a mixing tank, and stirred while being heated to dissolve the components, and a cellulose acetate solution was prepared.
(Composition of Cellulose Acetate Solution)

| | |
|---|---|
| Cellulose Acetate Having Acetylation Degree of 60.7% to 61.1% | 100 parts by mass |
| Triphenyl Phosphate (plasticizer) | 7.8 parts by mass |
| Biphenyl Diphenyl Phosphate (plasticizer) | 3.9 parts by mass |
| Methylene Chloride (first solvent) | 336 parts by mass |
| Methanol (second solvent) | 29 parts by mass |
| 1-Butanol (third solvent) | 11 parts by mass |

16 parts by mass of the following retardation raising agent (A), 92 parts by mass of methylene chloride, and 8 parts by mass of methanol were put into another mixing tank, and stirred while being heated, and thus a retardation raising agent solution was prepared.

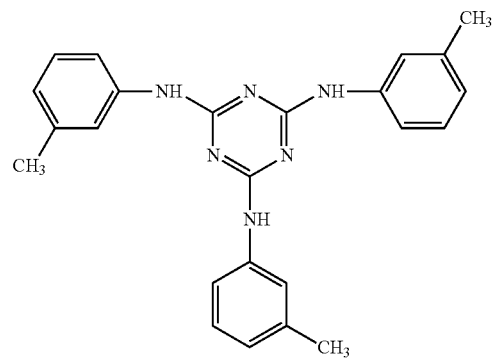

Retardation Raising Agent (A)

474 parts by mass of the cellulose acetate solution was mixed with 25 parts by mass of the retardation raising agent solution, and the mixture was sufficiently stirred to prepare a dope. The amount of the retardation raising agent (A) added was 6.0 parts by mass with respect to 100 parts by mass of cellulose acetate.

The obtained dope was cast using a band stretching machine. After the temperature of a surface of the film on a band became 40° C., the film was dried for 1 minute with warm air at 70° C., and was dried for 10 minutes with drying air at 140° C. to produce a triacetyl cellulose film having a residual solvent content of 0.3 mass %.

This film is used as a support.

<Preparation of Photo-Alignment Film Composition>
<<Polymer>>

A reaction container provided with a stirrer, a thermometer, a drip funnel, and a reflux cooling pipe was charged with 100 parts by mass of 2-(3,4-epoxycyclohexyl)ethyltrimethoxysilane, 500 parts by mass of methyl isobutyl ketone, and 10 parts by mass of trimethylamine, and the materials were mixed at room temperature.

Next, using the drip funnel, 100 parts by mass of deionized water was added dropwise to the solution in the reaction container for 30 minutes, and then the obtained solution was reacted for 6 hours at 80° C. while being mixed under reflux. After the reaction was completed, an organic phase was extracted from the solution and washed by a 0.2 mass % ammonium nitrate aqueous solution until the water after the washing of the organic phase became neutral. Thereafter, the solvent and the water were distilled away under reduced pressure, and thus an epoxy group-containing polyorganosiloxane was obtained as a viscous transparent liquid.

The epoxy group-containing polyorganosiloxane was subjected to nuclear magnetic resonance analysis ($^1$H-NMR). It was confirmed that a peak based on an oxiranyl group was obtained in accordance with a theoretical intensity in the vicinity of a chemical shift ($\delta$)=3.2 ppm, and a side reaction of the epoxy group did not occur during the reaction. The weight average molecular weight Mw of the epoxy group-containing polyorganosiloxane was 2,200, and the epoxy equivalent was 186 g/mol.

Next, 100 mL of a three-necked flask was charged with 10.1 parts by mass of the epoxy group-containing polyorganosiloxane obtained as described above, 0.5 parts by mass of an acrylic group-containing carboxylic acid (trade name "ARONIX m-5300", manufactured by TOAGOSEI CO., LTD., ω-carboxy polycaprolactone acrylate (degree of polymerization n~ 2)), 20 parts by mass of butyl acetate, 1.5 parts by mass of a cinnamic acid derivative obtained by a method of Synthesis Example 1 in JP2015-26050A, and 0.3 parts by mass of tetrabutylammonium bromide, and the obtained reaction solution was stirred for 12 hours at 90° C.

After the reaction was completed, the reaction solution was diluted with the same amount (mass) of butyl acetate, and water washing was performed 3 times.

Concentration of the obtained solution and dilution with butyl acetate were repeated 2 times, and finally, a solution containing a polyorganosiloxane (polymer) having a photo-aligned group was obtained. The weight average molecular weight Mw of polymer was 9,000. In addition, as a result of $^1$H-NMR, a component having a cinnamate group in the polymer was 23.7 mass %.

<Photo-Alignment Film Composition>>

Butyl acetate as a solvent, the polymer produced in advance, and the following compounds D1 and D2 were added in the following amounts to prepare a photo-alignment film composition.

(Photo-Alignment Film Composition)

| | |
|---|---|
| Butyl Acetate | 100 parts by mass |
| Polymer | 4.35 parts by mass |
| Compound D1 | 0.48 parts by mass |
| Compound D2 | 1.15 parts by mass |

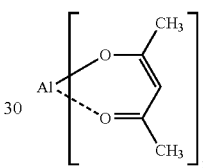

D1

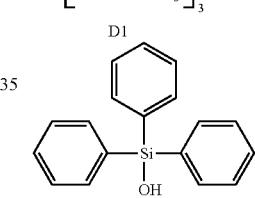

D2

<Preparation of Coating Liquid 1 for Patterned Optical Anisotropic Layer>

A coating liquid 1 for a patterned optical anisotropic layer having the following composition was prepared.

(Coating Liquid 1 for Patterned Optical Anisotropic Layer)

| | |
|---|---|
| Methoxyethyl Acrylate | 211 parts by mass |
| The Following Mixture of Rod-like Liquid Crystal Compounds | 100 parts by mass |
| The Following Monomer | 5 parts by mass |
| The Following Polymerization Initiator | 6 parts by mass |
| The Following Surfactant | 0.25 parts by mass |

Mixture of Rod-like Liquid Crystal Compounds

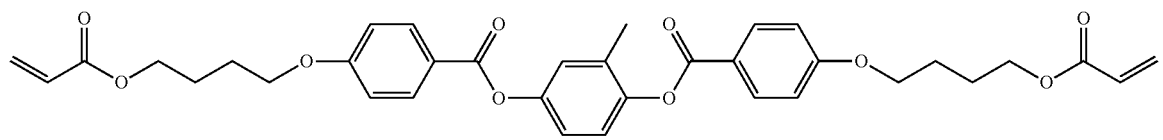 [SMILES: C=CC(=O)OCCCCOc1ccc(C(=O)Oc2ccc(OC(=O)c3ccc(OCCCCOC(=O)C=C)cc3)c(C)c2)cc1]

84%

-continued

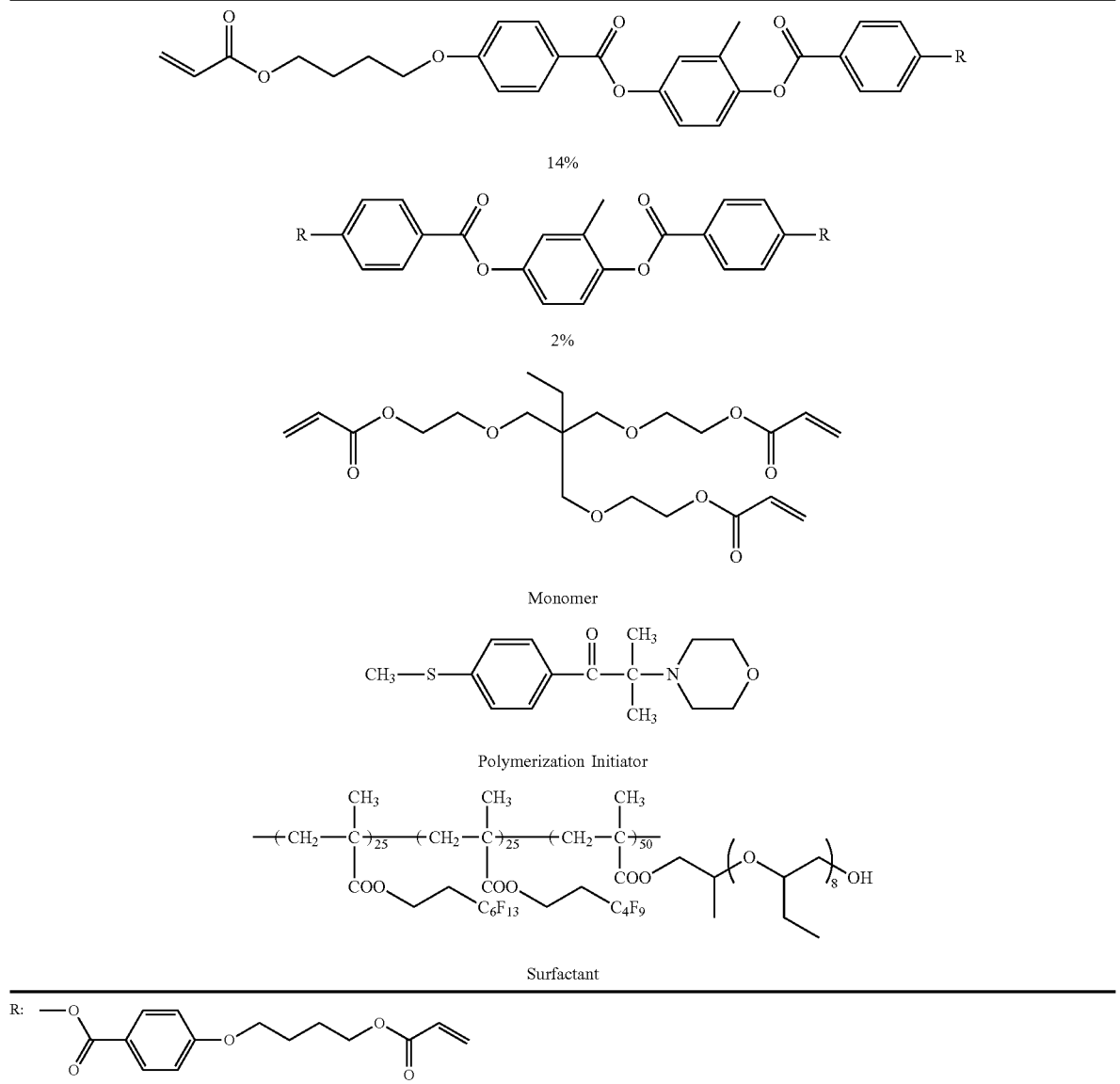

<Formation of Photoisomerization Composition Layer>

By a spin coating method, the photo-alignment film composition prepared in advance was applied to the support produced in advance. Then, the support to which the photo-alignment film composition was applied was dried for 5 minutes on a hot plate at 100° C. to remove the solvent, and a photoisomerization composition layer having a thickness of 0.2 µm was formed.

<Formation of Photo-Alignment Film>

A photo-alignment film was produced as follows using a moving stage (ALS-305-CM, manufactured by CHUO PRECISION INDUSTRIAL CO., LTD.), a rotating stage (SGSP-60YAW-OB, manufactured by SIGMAKOKI Co., LTD.), a light screen, a wire grid polarizing plate (commodity code #46-636, manufactured by EDMUND OPTICS), and an ultraviolet irradiation machine (EX250-W, manufactured by HOYA-SCOTT CO.).

Figure 4:
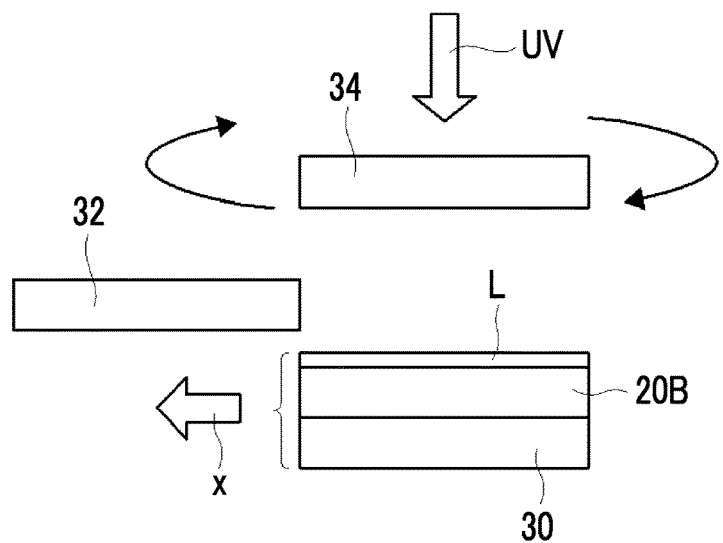
FIG. 4 is a schematic view for illustrating an example of a method of manufacturing the polarization detection filter illustrated in FIG. 2.

As schematically illustrated in FIG. 4, the support with a photoisomerization composition layer produced thereon was placed on the moving stage, and the light screen was fixed and disposed above the moving stage. The light screen was provided such that an end side thereof coincided with an end side of the support and the support was not covered. Accordingly, in a case where the moving stage was moved toward the light screen, the photoisomerization composition layer of the support was hidden under the light screen by a moving amount.

The rotating stage was fixed and disposed on the moving stage, and the wire grid polarizing plate was placed on the rotating stage so as to be rotated. The polarization axis of the wire grid polarizing plate was made to coincide with a moving direction of the moving stage.

30 mJ/cm$^2$ of ultraviolet light was applied through the wire grid polarizing plate. Then, the moving stage was moved by 15 µm, and the wire grid polarizing plate was rotated by 5°. Then, ultraviolet irradiation was performed similarly. After that, the movement of the moving stage by 15 µm, the rotation of the polarizing plate by 5°, and the ultraviolet irradiation were repeatedly performed until the total running distance of the moving stage became 21 mm, and thus a photo-alignment film was formed on the support. That is, the number of repetitions is 1,400.

<Production of Phase Difference Plate 1 (λ/2 Plate) (Formation of Patterned Optical Anisotropic Layer 1)>

The coating liquid 1 for a patterned optical anisotropic layer prepared in advance was applied to the photo-alignment film formed as described above by a spin coating method.

Then, the support to which the coating liquid 1 for a patterned optical anisotropic layer was applied was dried for 2 minutes on a hot plate at 90° C., and thus a composition layer to be a patterned optical anisotropic layer was formed. Then, the layer was held at 60° C., and the alignment was fixed by ultraviolet irradiation (500 mJ/cm$^2$) to form a patterned optical anisotropic layer 1 having a film thickness of 1.8 μm, and thus a phase difference plate 1 was produced.

<Production of Phase Difference Plate 2 (λ/4 Plate) (Formation of Patterned Optical Anisotropic Layer 2)>

A coating liquid 2 for a patterned optical anisotropic layer was prepared in the same manner, except that the amount of methoxyethyl acrylate (solvent amount) was changed to 533.68 parts by mass in the preparation of the coating liquid 1 for a patterned optical anisotropic layer.

A patterned optical anisotropic layer 2 was formed in the same manner as in the case of the patterned optical anisotropic layer 1, except that the coating liquid 2 for a patterned optical anisotropic layer was used, and a phase difference plate 2 was produced.

Both the phase difference plate 1 and the phase difference plate 2 have 36 belt-like regions in which the angle of a slow axis is changed within a range of 0° to 180° at intervals of 5° with respect to the reference direction. That is, in the phase difference plate 1 and the phase difference plate 2, the 36 belt-like regions form one unit. Accordingly, 36×36 intersection regions formed by arranging the phase difference plate 1 and the phase difference plate 2 such that the belt-like regions thereof are perpendicular to each other correspond to one pixel in a polarization imaging sensor, and by virtue of a light intensity distribution thereof, a polarization state at the above pixel can be detected.

In addition, the unit formed of 36 belt-like regions is repeatedly formed 38 times in both the phase difference plate 1 and the phase difference plate 2, and thus a polarization imaging sensor capable of performing photographing with 38×38 pixels can be produced.

<Confirmation of Patterned Optical Anisotropic Layer>

The patterned optical anisotropic layer 1 of the phase difference plate 1 and the patterned optical anisotropic layer 2 of the phase difference plate 2 produced were observed by a polarizing microscope (ECLIPSE E600-POL).

As a result, it was possible to confirm that in both the patterned optical anisotropic layers, belt-like regions of which the slow axis direction continuously changes from 0° to 180° at intervals of 5° with respect to the reference direction (moving direction of the moving stage) are repeatedly formed continuously in a direction perpendicular to a longitudinal direction at a width of 15 μm as illustrated in FIG. 3.

<Measurement of Front Phase Difference>

In order to measure a front phase difference, a photo-alignment film was formed in the same manner, except that a photoisomerization composition layer having a thickness of 0.2 jam to be a photo-alignment film was formed on a support, and ultraviolet irradiation (30 mJ/cm$^2$) was performed 1 time without the rotation of a wire grid polarizing plate.

Similarly, the coating liquid 1 for a patterned optical anisotropic layer and the coating liquid 2 for a patterned optical anisotropic layer were applied, dried, and cured by ultraviolet light, and a phase difference plate 1-2 having a patterned optical anisotropic layer 1 having a film thickness of 1.8 μm and a phase difference plate 2-2 having a patterned optical anisotropic layer 2 having a film thickness of 0.9 μm were produced.

The front phase differences of the phase difference plates were measured using Axometry (manufactured by Axometrics, Inc.). As a result, the front phase difference of the phase difference plate 1-2 was 275 nm, and the front phase difference of the phase difference plate 2-2 was 138 nm.

<Production of Polarization Imaging Sensor>

A polarization detection filter was produced using the phase difference plates 1 and 2 produced as described above and a wire grid polarizing plate filter (commodity code #33-082, manufactured by EDMUND OPTICS).

The polarization detection filter was produced by bonding the phase difference plate 2 (λ/4 plate) as a first phase difference plate, the phase difference plate 1 (λ/2 plate) as a second phase difference plate, and the wire grid polarizing plate in this order using a pressure sensitive adhesive. In this case, the first phase difference plate and the second phase difference plate were disposed such that belt-like regions thereof were perpendicular to each other.

Thereafter, the polarization detection filter was bonded on a light-receiving surface of a universal serial bus (USB) camera (UI-1490LE-M, manufactured by Prolinx Corporation) with a pressure sensitive adhesive, and a polarization imaging sensor was produced. In this case, the wire grid polarizing plate filter was provided adjacent to light-receiving elements.

As described above, in the phase difference plate 2 and the phase difference plate 1, one unit formed of 36 belt-like regions corresponding to one pixel of the polarization imaging sensor is repeatedly formed 38 times. Accordingly, the polarization imaging sensor (polarization detection filter) is a polarization imaging sensor having 1,444 pixels of 38×38.

<Confirmation of Polarization Measurement>

Figure 5:
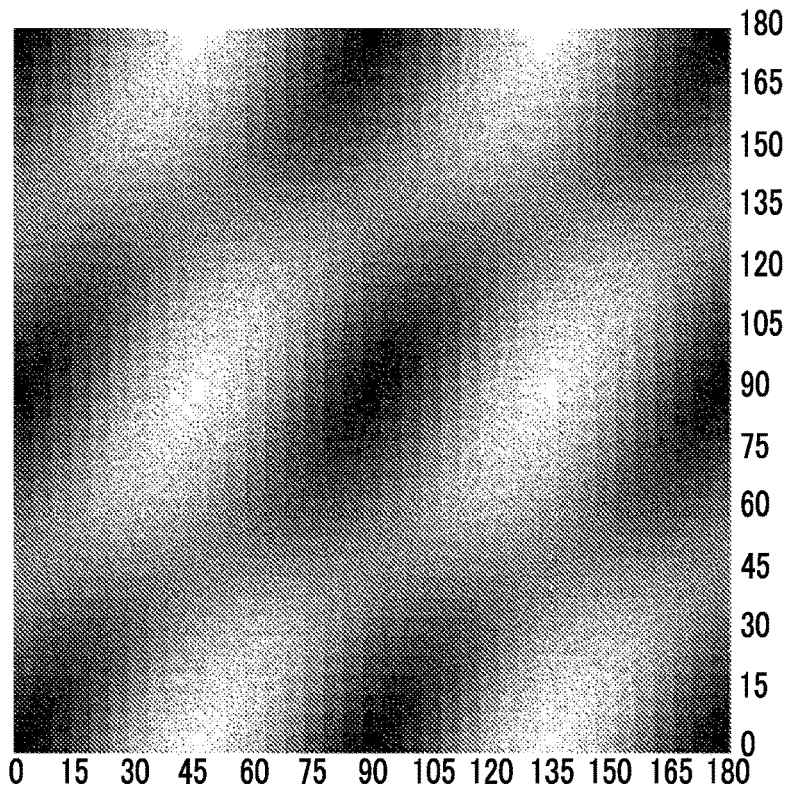
FIG. 5 is a view illustrating an example of the detection result of linear polarization obtained by the polarization imaging sensor according to the invention.

One linear polarizing plate was placed on a plane light source (light emitting diode (LED) Viewer Pro, manufactured by FUJIFILM Corporation), and the produced polarization imaging sensor photographed an image of light transmitted through the linear polarizing plate. As a result, the light intensity distribution of the pixels of the polarization imaging sensor was confirmed to be similar to FIG. 5.

Figure 6:
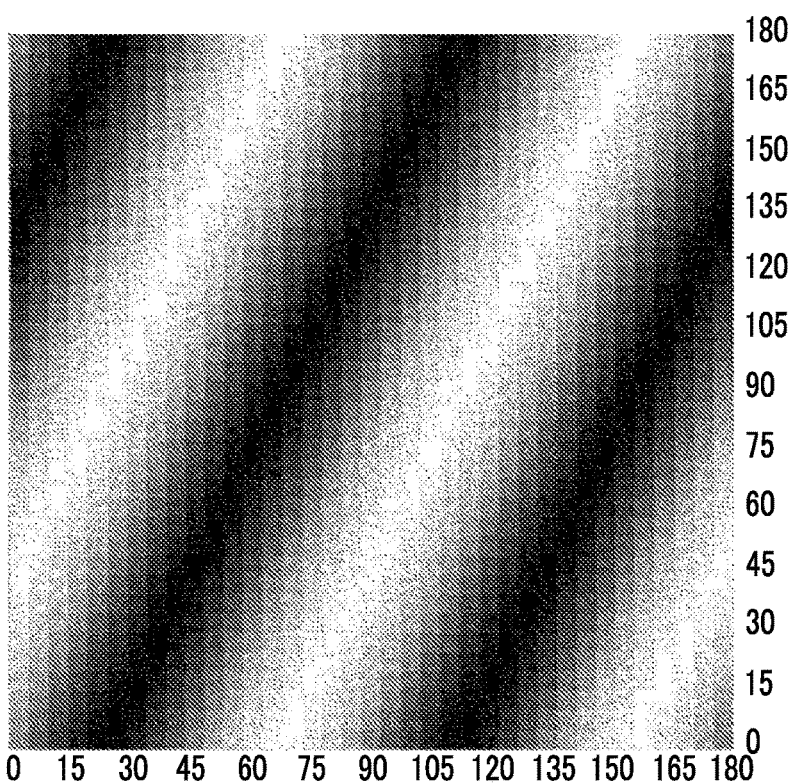
FIG. 6 is a view illustrating an example of the detection result of circular polarization obtained by the polarization imaging sensor according to the invention.

In addition, photographing was performed in the same manner, except that a circular polarizing plate was used in place of the linear polarizing plate, and the light intensity distribution of the pixels of the polarization imaging sensor was confirmed to be similar to FIG. 6.

Accordingly, it was possible to confirm that the polarization imaging sensor according to the invention can detect a light polarization state.

The effects of the invention are obvious due to the above reasons.

EXPLANATION OF REFERENCES

10: polarization imaging sensor
12: polarization detection filter
14: image sensor
20: first phase difference plate 20A: patterned optical anisotropic layer
20B: support
20a, 24a: first belt-like region
20b, 24b: second belt-like region
20c, 24c: third belt-like region
20d, 24d: fourth belt-like region
20e, 24e: fifth belt-like region
20f, 24f: sixth belt-like region
20g, 24g: seventh belt-like region
20h, 24h: eighth belt-like region
20i, 24i: ninth belt-like region
20j, 24j: tenth belt-like region
20k, 24k: eleventh belt-like region
20l, 24l: twelfth belt-like region
24: second phase difference plate
24A: patterned optical anisotropic layer
24B: support
26: polarizing plate
28: bonding layer
30: moving stage
32: light screen
34: linear polarizing plate
L: photoisomerization composition layer

What is claimed is:

1. An optical laminated film comprising:
a first phase difference plate having a patterned optical anisotropic layer;
a second phase difference plate having a patterned optical anisotropic layer; and
a polarizing plate having a polarization axis in one direction,
wherein the patterned optical anisotropic layer of the first phase difference plate and the patterned optical anisotropic layer of the second phase difference plate have a constant phase difference, and are divided into a plurality of belt-like regions in the same plane,
the patterned optical anisotropic layer of the first phase difference plate and the patterned optical anisotropic layer of the second phase difference plate have a plurality of units, each formed of the plurality of belt-like regions in which slow axis directions in one belt-like region coincide with each other, and slow axis directions in the respective belt-like regions are all different, and
the belt-like regions of the patterned optical anisotropic layer of the first phase difference plate and the belt-like regions of the patterned optical anisotropic layer of the second phase difference plate are disposed to intersect with each other in a plane direction, and the first phase difference plate, the second phase difference plate, and the polarizing plate are laminated in this order.

2. The optical laminated film according to claim 1, wherein the patterned optical anisotropic layer of the first phase difference plate and the patterned optical anisotropic layer of the second phase difference plate repeatedly have the same unit in an arrangement direction of the belt-like regions.

3. The optical laminated film according to claim 1, wherein in the patterned optical anisotropic layer of the first phase difference plate and the patterned optical anisotropic layer of the second phase difference plate, the slow axis direction of the belt-like regions in the unit sequentially changes toward an arrangement direction of the belt-like regions.

4. The optical laminated film according to claim 1, wherein the belt-like regions of the patterned optical anisotropic layer of the first phase difference plate and the belt-like regions of the patterned optical anisotropic layer of the second phase difference plate are perpendicular to each other in the plane direction.

5. The optical laminated film according to claim 1, wherein the first phase difference plate and the second phase difference plate are different phase difference plates.

6. The optical laminated film according to claim 5, wherein one of the first phase difference plate and the second phase difference plate is a $\lambda/4$ plate, and the other is a $\lambda/2$ plate.

7. The optical laminated film according to claim 1, wherein in the patterned optical anisotropic layer of the first phase difference plate and the patterned optical anisotropic layer of the second phase difference plate, the slow axis direction of the belt-like regions in the unit changes from 0° to 180° with respect to an arrangement direction of the belt-like regions.

8. The optical laminated film according to claim 1, wherein the patterned optical anisotropic layer of the first phase difference plate and the patterned optical anisotropic layer of the second phase difference plate contain a liquid crystal compound.

9. A polarization imaging sensor comprising:
the optical laminated film according to claim 1; and
an image sensor.

* * * * *